United States Patent [19]

Dodabalapur et al.

[11] Patent Number: 5,596,208
[45] Date of Patent: Jan. 21, 1997

[54] ARTICLE COMPRISING AN ORGANIC THIN FILM TRANSISTOR

[75] Inventors: Ananth Dodabalapur, Millington; Howard E. Katz, Summit; Luisa Torsi, Murray Hill, all of N.J.

[73] Assignee: Lucent Technologies Inc., Murray Hill, N.J.

[21] Appl. No.: 644,596

[22] Filed: May 10, 1996

Related U.S. Application Data

[63] Continuation of Ser. No. 353,024, Dec. 9, 1994, abandoned.

[51] Int. Cl.$^6$ .................. H01L 29/76; H01L 31/036; H01L 31/112
[52] U.S. Cl. ............... 257/66; 257/40; 257/289; 257/403; 257/642
[58] Field of Search .................. 257/40, 289, 410, 257/347, 642, 285, 349, 404, 403

[56] References Cited

U.S. PATENT DOCUMENTS

| | | | |
|---|---|---|---|
| 4,021,835 | 5/1977 | Etoh et al. | 257/404 |
| 5,247,193 | 9/1993 | Menda | 257/85 |
| 5,331,183 | 7/1994 | Sariciftci et al. | 257/40 |
| 5,335,235 | 8/1994 | Nishizawa et al. | 257/40 |
| 5,350,459 | 9/1994 | Suzuki et al. | 257/40 |
| 5,525,811 | 7/1996 | Sakurai et al. | 257/40 |

FOREIGN PATENT DOCUMENTS 3-151667  6/1991  Japan ..................... 257/40

*Primary Examiner*—Peter Toby Brown
*Assistant Examiner*—Howard Weiss
*Attorney, Agent, or Firm*—Eugen E. Pacher

[57] ABSTRACT

Articles according to the invention comprise an improved organic thin film transistor (TFT) that can have substantially higher source/drain current on/off ratio than conventional organic TFTs. An exemplary TFT according to the invention comprises, in addition to a p-type first organic material layer (e.g., α-6T), an n-type second organic material layer (e.g., Alq) in contact with the first material layer. TFTs according to the invention can be advantageously used in, for instance, active liquid crystal displays and electronic memories.

15 Claims, 3 Drawing Sheets

ARTICLE COMPRISING AN ORGANIC THIN FILM TRANSISTOR

This application is a continuation of application Ser. No. 08/353,024, filed on Dec. 9, 1994, now abandoned.

FIELD OF THE INVENTION

This invention pertains to thin film transistors (TFTs), more specifically, to TFTs that comprise organic active layer material.

BACKGROUND OF THE INVENTION

Thin film transistors (TFTs) are known, and are of considerable commercial significance. For instance, amorphous silicon-based TFTs are used in a large fraction of active matrix liquid crystal displays.

TFTs with an organic active layer are also known. See, for instance, F. Garnier et al., *Science*, Vol. 265, pp. 1684–1686; H. Koezuka et al., *Applied Physics Letters*, Vol. 62 (15), pp. 1794–1796; H. Fuchigami et al., *Applied Physics Letters*, Vol. 63 (10), pp. 1372–1374; G. Horowitz et al., *J. Applied Physics*, Vol. 70 (1), pp. 469–475, and G. Horowitz et al., *Synthetic Metals*, Vol. 41–43, pp. 1127–1130. These devices typically are field effect transistors (FETs). Such devices potentially have significant advantages over conventional TFTs, including a potentially simpler (and consequently cheaper) fabrication process, the possibility for low temperature processing, and compatibility with non-glass (e.g., plastic) substrates. Bipolar transistors that utilize both p-type and n-type organic material are also known. See, for instance, U.S. Pat. No. 5,315,129. S. Miyauchi et al., *Synthetic Metals*, 41–43 (1991), pp. 1155–1158, disclose a junction FET that comprises a layer of p-type polythiophene on n-type silicon.

However, despite considerable research and development effort, "organic" TFTs have not yet reached commercialization, at least in part due to relatively poor device characteristics of prior art organic TFTs.

An important device characteristic of a switching transistor is the on/off ratio of the source/drain current. Prior art organic TFTs typically have relatively low on/off ratios. For instance, H. Fuchigami et al. (op. cit.) recently reported a device that had carrier mobility comparable to amorphous silicon, but had an on/off ratio of only about 20 at −30 V gate-source voltage. That paper also discloses purification of semiconducting materials to reduce the carrier scattering by impurities.

H. Koezuka et al. (op. cit.) report attainment of an on/off ratio (modulation ratio) of the channel current of about $10^5$ in a device with doped polypyrole-coated (a highly conducting polymer) source and drain contacts. According to these authors, this is the highest on/off ratio achieved in organic FETs. Nevertheless, the reported on/off ratio is still substantially smaller than on/off ratios typically available in conventional FETs and demanded for many potential applications of organic TFTs. Furthermore, the organic TFT had very low carrier mobility ($2\times10^{-4}$ cm$^2$/V·s), and thus would not have been suitable for high-speed operation. European patent application No. 92307470.2 (publication No. 0 528 662 A1) discloses an organic FET that comprises a first organic layer that constitutes a channel between source and drain electrodes and is in contact with a second organic layer that is disposed between the gate electrode and the source and drain electrodes. The first and second organic layers are of the same conductivity type but differ in their carrier concentration.

In view of the potential significance of organic TFTs, it would be desirable to have available such devices that have improved characteristics, including improved on/off ratio of the source/drain current. This application discloses such devices, and a method of making the devices.

Definitions and Glossary

An "organic semiconductor" herein is a material that contains a substantial amount of carbon in combination with other elements, or that comprises an allotrope of elemental carbon (excluding diamond), and exhibits charge carrier mobility of at least $10^{-3}$ cm$^2$/V·s at room temperature (20° C.). Organic semiconductors of interest herein will typically have conductivity less than about 1S/cm at 20° C.

A "p-type" ("n-type") organic semiconductor herein is an organic semiconductor in which the Fermi energy is closer to (farther from) the energy of the highest occupied orbital of the molecules or aggregates present in the material than it is to (from) the energy of the lowest unoccupied orbital. The term is also intended to mean an organic semiconductor which transports positive charge carriers more (less) efficiently than negative carriers. Positive (negative) carriers are generally referred to as "holes" ("electrons").

An organic "p-n junction" herein is the contact region between a p-type and a n-type organic semiconductor.

SUMMARY OF THE INVENTION

In a broad aspect the invention is embodied in an article that comprises a novel organic TFT that can have substantially improved characteristics (e.g., on/off ratio), as compared to prior art organic TFTs.

Specifically, the organic TFT comprises organic material, spaced apart first and second contact means (e.g., gold electrodes) in contact with the organic material, and third contact means that are spaced from each of the first and second contact means and that are adapted for controlling, by means of a voltage applied to the third contact means, a current between the first and the second contact means. Significantly, the organic material comprises a layer of a first organic material of a first conductivity type and a layer of a second organic material of a second conductivity type that is in contact with the layer of the first organic material at least in a region between the first and second contact means and forms a p-n junction with the layer of first organic material, the layer of the first organic material being in contact with each of the first and second contact means and being not in contact with the third contact means. The third contact means generally can be identified with the gate contact in prior art devices, and the first and second contact means with the source and drain contacts of prior art devices.

Exemplarily, a TFT according to the invention has exhibited an on/off ratio of more than $10^6$, substantially higher than the ratios exhibited by prior art organic TFTs. The exemplary TFT according to the invention furthermore exhibited relatively high carrier mobility, in excess of 0.01 cm$^2$/V·s. Desirably, TFTs according to the invention exhibit an on/off ratio greater than $10^5$ at an operating gate voltage, and a carrier mobility of at least $5\times10^{-3}$ cm$^2$/V·s, all at 20° C.

The layer of the first organic material in TFTs according to the invention can comprise any of the organic materials known to be suitable for use as the active layer in organic TFTs. Among these materials are polythiophene and substituted derivatives thereof such as poly(3-hexylthiophene and poly(3-octylthiophene) polythienylenevinylene, α-hexathienylene (α-6T) and substituted derivatives thereof such as α, ω-dihexyl-α-6T. Other suitable first organic materials are disclosed in U.S. Pat. No. 5,315,129 and in G. Horowitz et al., *Synthetic Metals*, Vol. 41–43, pp. 1127–1130, both incorporated herein by reference. Exemplarily, the first organic material is selected from polymers of thiophene of degree of polymerization greater than three (and typically less than 9), polymers of substituted derivatives of thiophene, and poly(thienylenevinylene):

The above recited compounds are p-type organic semiconductors, but the invention is not so limited. We currently believe that other organic compounds that can be deposited in thin film form and that are n-type are also likely to be suitable for use as the first organic material in transistors according to the invention, and use of these compounds is contemplated. We currently prefer first organic semiconductor materials that can be deposited in crystalline (typically polycrystalline) form, but amorphous layers may also have utility.

Among the second organic materials that are suitable for use in the invention are 8-hydroxyquinoline aluminum (Alq) and $C_{60}$. However, the invention is not so limited, and the use of other organic materials, including p-type materials, is contemplated.

In a first exemplary embodiment of the invention the transistor further comprises a dielectric layer disposed between the third contact means and both of the first and second contact means, with the first organic material layer in contact with the dielectric layer. Transistors of this embodiment have a structure analogous to that of conventional metal-insulator-semiconductor (MIS) FETs and will be referred to as organic TFTs of the MIS-FET type.

In a second exemplary embodiment the third contact means of the transistor are disposed on the second organic material layer and are spaced from the first organic material layer. Transistors of this embodiment have a structure analogous to that of conventional junction FETs (J-FETs) and will be referred to as organic TFTs of the J-FET type.

A third exemplary embodiment is similar to the above first embodiment, but with the order of the first and second organic material layers interchanged.

Transistors according to the invention are advantageously used in articles such as display systems, memories, and other analog and/or digital circuits.

DETAILED DESCRIPTION

Figure 1:
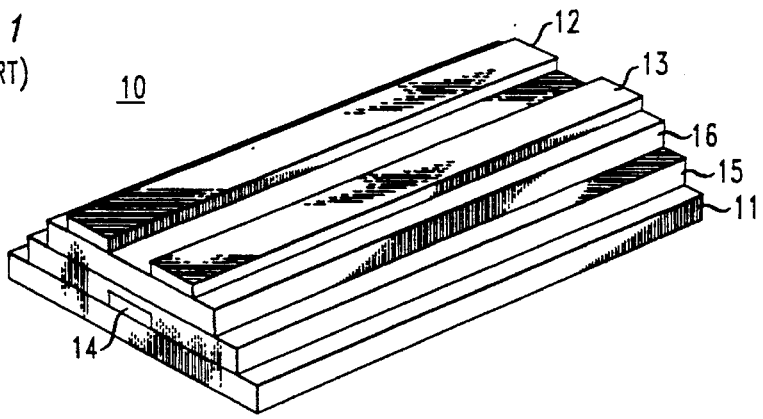
FIG. 1 schematically shows an exemplary prior art organic TFT.

Prior art organic TFTs typically are MIS-FET-type or hybrid J-FET-type transistors and can be embodied in a variety of structures. An exemplary prior art MIS-FET-type TFT (10) with organic active layer is schematically depicted in FIG. 1, wherein numerals 11–16 refer, respectively, to the substrate (e.g., glass, plastic, metal, semiconductor), source electrode, drain electrode, gate electrode, gate insulator layer and organic active material (organic semiconductor) layer. As those skilled in the art will appreciate, means for causing the flow of charge carriers between source and drain, and means for applying a voltage to the gate electrode will be present in a working device but are not shown.

Figure 2:
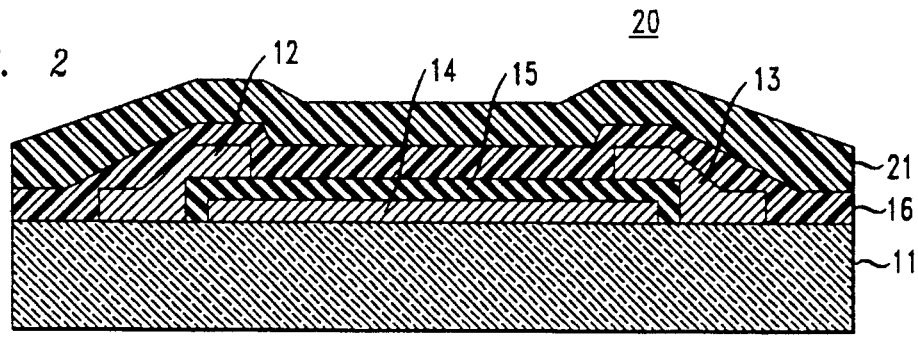
FIGS. 2–4 schematically show exemplary transistors according to the invention.

FIG. 2 schematically shows an exemplary MIS-FET-type device (20) according to the invention. Numerals 11–16 refer to elements that respectively correspond to elements of the same reference numeral in FIG. 1, and numeral 21 refers to an organic material layer that is of the opposite conductivity type as layer 16, and forms a p-n junction therewith. Exemplarily, layer 16 is p-type (e.g., α-6T) and layer 21 is n-type (e.g., Alq).

We have discovered that provision of an appropriate layer 21 can result in substantially improved device performance, typically a significant decrease in the "off" current between source and drain, with corresponding increase in the on/off ratio of the transistor.

We currently believe that the decrease in the "off" current is associated with the contact between appropriate organic layers 16 and 21, e.g., the α-6T/Alq interface, and attendant depletion of the (p-type) residual carriers in the layer (e.g., 16) of first organic material.

By analogy with conventional p-n junctions, it can be said that the width W of the depletion layer formed at the first/second organic material interface at zero bias is $(2\epsilon_1 V_{bi}/qN_1)^{1/2}$, where $\epsilon_1$ is the dielectric constant of the first organic material, $V_{bi}$ is the "built-in" potential $|E_{F1}-E_{F2}|/q$, $N_1$ is the free carrier density in the first organic material, q is the elementary charge ($1.6\times10^{-19}$C), and $E_{F1}$ and $E_{F2}$ are the Fermi energy in the first and second organic materials, respectively. In the above expression for W it is assumed that the second organic material has much higher free carrier density than the first organic material.

We currently believe that the presence of a depletion region of non-zero width at zero bias results in lower current between the first and second contact means ($I_D$) at zero bias by causing many of the free carriers in the first organic material layer to be electrically inactive.

The above remarks are offered for tutorial reasons only, and are not intended to limit the claims.

A significant feature of transistors according to the invention is a relatively large (e.g., $\geq 0.5$ V) value of $V_{bi}$. This in turn requires a relatively large difference in Fermi energy between the first and second organic materials.

Figure 8:
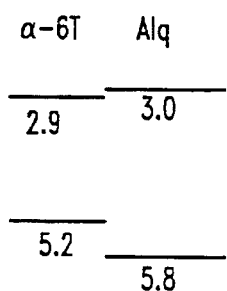
FIGS. 8 and 9 schematically show the band edge alignment of isolated α-6T and Alq, and the band edges of α-6T in contact with Alq.
Figure 9:
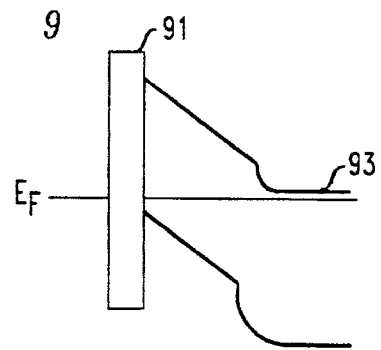

This is exemplarily illustrated in FIGS. 8 and 9, which schematically respectively show the band edge alignment of isolated α-6T and Alq, and the band edges of α-6T in contact with Alq. As is well known, α-6T and Alq are recognized as p-type and n-type organic semiconductors, respectively. The numerical values in FIG. 8 are in electron volts, and numerals 91–93 in FIG. 9 refer to insulator, α-6T and Alq, respectively.

Figure 5:
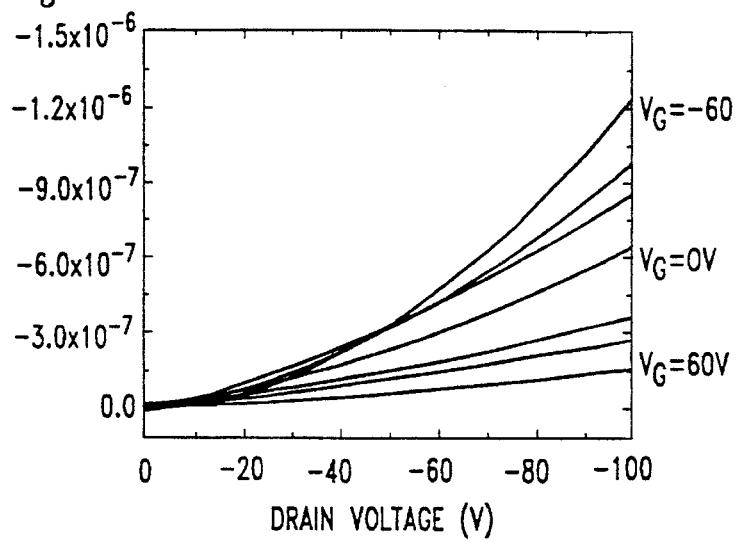
FIGS. 5 and 6 show performance data of a MIS-FET-type transistor before and after provision of a second organic material layer.
Figure 6:
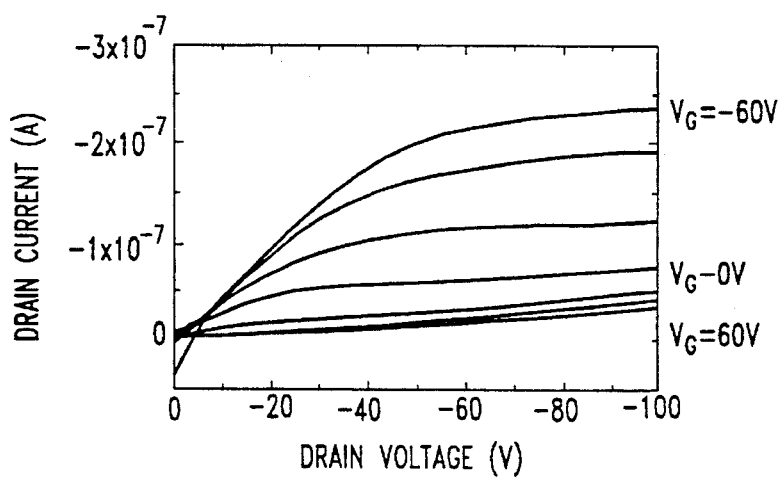

FIGS. 5 and 6 show comparative data for a MIS-FET-type organic TFT without and with second organic material layer, respectively. The data of FIG. 5 were obtained from a transistor of the type shown in FIG. 2, but without layer 21.

The substrate was silicon, the gate contact was a 30 nm thick gold stripe. The gate dielectric was a 300 nm thick layer of conventionally formed $SiO_2$. The gold source and drain electrodes were 30 nm thick, 250 μm long and 100 μm wide, and were spaced apart by a distance of 12 μm. The p-type organic semiconductor layer was 50 nm thick α-6T. The data of FIG. 6 were obtained from the above described transistor, but with a 60 nm thick Alq layer deposited on the α-6T layer. As can be seen from the figures, provision of the Alq layer resulted in a significant decrease in drain current ($I_D$) at zero gate bias ($V_G$=0), exemplarily from −1.1 μA to −68 nA.

Figure 3:
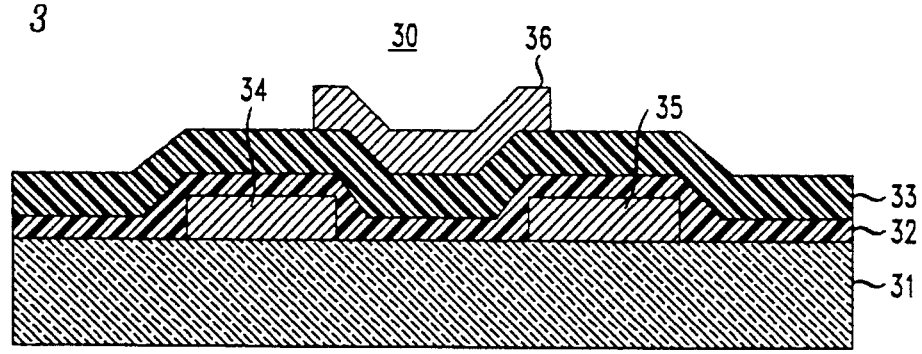
Figure 7:
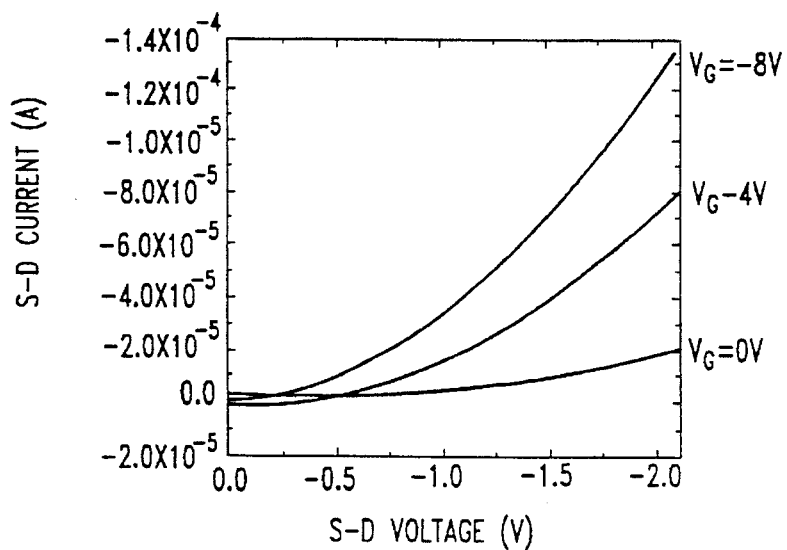
FIG. 7 shows performance data of a J-FET-type transistor according to the invention.

FIG. 7 shows similar performance data for a J-FET-type organic TFT according to the invention. As can be seen, the device has desirably low $I_D$ at $V_G$=0. FIG. 3 schematically depicts a J-FET-type organic TFT (30) according to the invention, with numerals 31–36 designating the insulating substrate, first organic material layer, second organic material layer, first contact means, second contact means, and third contact means, respectively.

Figure 4:
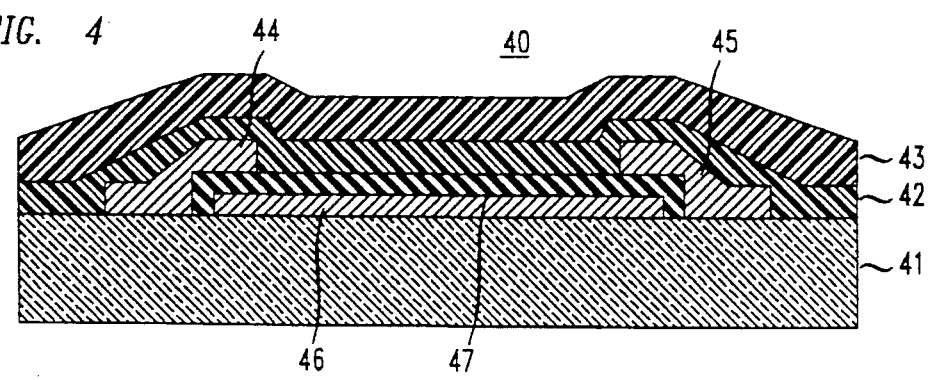

FIG. 4 schematically depicts a further exemplary embodiment of the invention that corresponds to the above described third embodiment. Numerals 41–47 refer, respectively, to the substrate, first organic semiconductor layer, second organic semiconductor layer, first contact, second contact, third contact, and gate dielectric. It will be understood that in this embodiment layer 42 is n-type organic semiconductor material.

The data of FIG. 7 were obtained from a TFT of the general type shown in FIG. 3. Specifically, the substrate was $SiO_2$-coated Si. An inter-digitated set of source/drain electrodes (10 nm Cr/30 nm Au) were formed on the substrate. The width and spacing of the fingers of the digitated structure was 10 μm; the overall dimensions of the structure are 2 mm×2 mm. A 50 nm layer of α-6T was evaporated over the interdigitated structure, and a 60 nm layer of Alq was evaporated onto the α-6T layer. A 100 nm thick and 3 mm wide finger of Al, defined by means of a shadow mask, was deposited on the Alq layer so as to extend across the source/drain spacing. The Al finger served as the gate electrode.

Transistors according to the invention can be produced by any appropriate method on any suitable substrate. Exemplary substrates are glass, plastics such as MYLAR® or KAPTON®, or Si (coated with $SiO_2$ or uncoated).

Although provision of a second organic material layer will generally result in improved device characteristics if the first organic material is of a purity that is conventionally found in prior art devices, we have also found that, at least in the case of devices that comprise α-6T, the use of higher purity first organic material may result in additional improvement in device characteristics. Techniques for purifying α-6T are described in our concurrently filed co-assigned patent application entitled "Method of Making an Organic Thin Film Transistor, and Article Made by the Method".

We have also found that an appropriate heat treatment of the deposited first organic material (e.g., α-6T) can change the morphology of the layer, and consequently further improve device characteristics. More specifically, we have found that rapid thermal annealing (RTA) of deposited films of α-6T can substantially increase the grain size of the material, to the extent that average grain size can exceed the channel length (typically 4–12 μm) of the intended TFT. If this is the case then the active material can behave substantially like a single crystal.

Typical as-deposited films of α-6T are polycrystalline, with average grain size of about 100 nm or less. Annealing such films for a short time (typically less than 10 seconds, e.g., 1 second) at a temperature close to (optionally even slightly above) the melting point (e.g., 295°–315° C.) exemplarily has resulted in increase of the average grain size to above 2 μm, exemplarily about 5–100 μm. Annealing is desirably in an inert atmosphere, e.g. $N_2$. Any suitable heat source (e.g., a bank of halogen lamps focused to a susceptor, or a graphite strip heater) can be used.

Although in many cases the carrier mobility in the p-type material will be substantially higher than the mobility in the n-type material (exemplarily by a factor of 100 or more), it may at times be advantageous if the respective mobilities in the two materials are comparable (e.g., are within a factor of about 10 of each other). If this is the case then it will be possible, by appropriate biasing of the gate electrode in a MIS-FET type structure such as is shown in FIG. 2, to obtain either an n-channel or a p-channel transistor. Those skilled in the art will recognize that the ability to form either n- or p-channel transistors makes possible fabrication of complementary circuits, and we contemplate use of TFTs according to the invention as building blocks in complementary analog and/or digital circuits.

Transistors according to the invention can be used as discrete devices but will more typically be used in integrated circuits that comprise a multiplicity of transistors according to the invention, possibly in conjunction with conventional semiconductor devices, with conductors interconnecting the devices and providing means for energizing the devices, providing input signals to the circuit and optionally receiving output signals therefrom.

Figure 10:
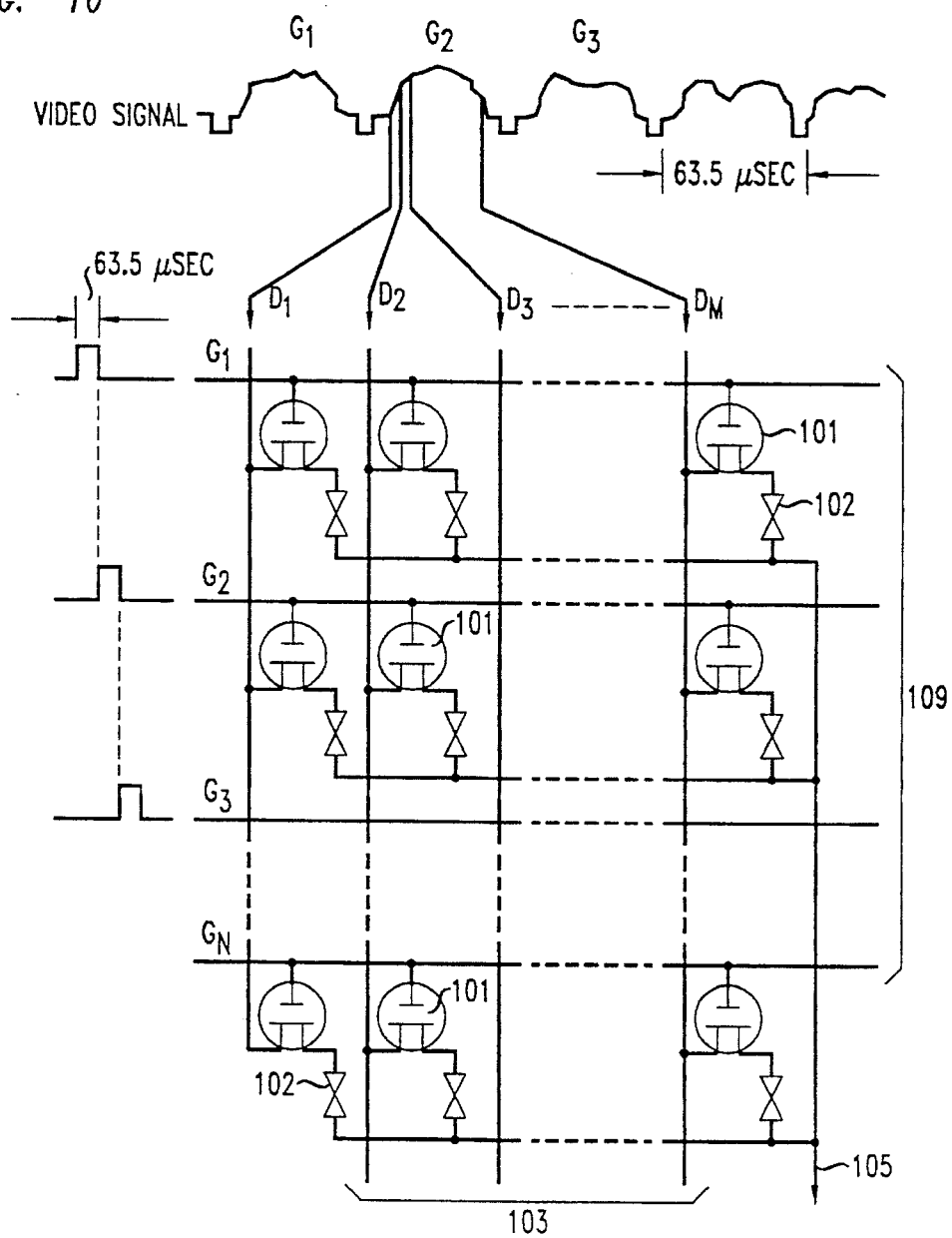
FIG. 10 shows an exemplary drive circuit in an active matrix liquid crystal display that comprises TFTs according to the invention.

By way of example, transistors according to the invention are used as current switches in liquid crystal displays in functionally the same way as prior art semiconductor TFTs are currently used. This is schematically illustrated in FIG. 10, which is based on an illustration at p. 102 of "Amorphous and Microcrystalline Devices", J. Kanicki, editor, Artech House, Boston (1991). FIG. 10 depicts relevant aspects of an exemplary circuit diagram of an active-matrix liquid crystal display, wherein transistors 101 are TFTs according to the invention, and the remainder of the circuit is conventional. Numerals 102 refer to liquid crystal, and numerals 103–105 refer to signal lines, gate lines and common electrode, respectively. Video signals and gate pulses are also shown schematically.

We claim:

1. An article comprising a thin film transistor comprising a) a layer of organic material;

b) spaced apart first and second contact means in contact with said layer of organic material;

c) third contact means that are spaced from each of said first and second contact means and that are adapted for controlling, by means of a voltage applied to the third contact means, a current between the first and the second contact means;

CHARACTERIZED IN THAT d) the layer of organic material comprises a layer of first organic material of a first conductivity type and a layer of a second organic material of a second conductivity type that is in contact with said layer of the first organic material at least in a region between said first and second contact means and forms a p-n junction therewith, the layer of the first organic material being in contact with each of the first and second contact means and being not in contact with the third contact means, wherein said first and second organic materials respectively have a first and a second energy gap between a highest occupied orbital and a lowest unoccupied orbital, and wherein said first and second organic materials are selected such that said first energy gap differs from said second energy gap.

2. Article according to claim 1, wherein the transistor comprises a dielectric layer disposed between the third contact means and both of the first and second contact means, with the first organic material layer in contact with the dielectric layer.

3. Article according to claim 2, wherein the first organic material layer is an n-type material layer.

4. Article according to claim 1, wherein the third contact means are disposed on the layer of the second organic material and are spaced from the layer of the first organic material.

5. An article according to claim 1, wherein the thin film transistor exhibits an on/off ratio greater than $10^5$ at an operating gate voltage and a carrier mobility of at least $5 \times 10^{-3}$ cm$^2$/V·s, all at 20° C.

6. An article according to claim 5, wherein the first organic material is p-type semiconductor material, with the charge carrier mobility in the p-type material exceeding the charge carrier mobility in the n-type second organic material at least by a factor of 100 at 20° C.

7. Article according to claim 2, wherein associated with each of said first and second organic materials is a charge carrier mobility, with the respective first to second charge carrier mobility ratio being in the range 0.1–10 at 20° C.

8. An article according to claim 1, wherein at least the first organic material layer comprises polycrystalline first organic material.

9. An article according to claim 6, wherein the second organic material comprises material selected from Alq and $C_{60}$.

10. An article according to claim 6, wherein the first organic material is selected from the group consisting of polymers of thiophene of degree of polymerization greater than three and less than nine, polymers of substituted derivatives of thiophene, and poly(thienylenevinylene).

11. An article according to claim 9, wherein the first organic material comprises material selected from the group consisting of α-6T, and substituted derivatives of α-6T.

12. An article according to claim 1, wherein the first and second semiconductor materials are selected such that $(|E_{F1}-E_{F2}|/q) > 0.5$ V, where $E_{F1}$ and $E_{F2}$ are the first and second material Fermi energy, respectively, and q is the absolute elementary charge value.

13. An article according to claim 1, wherein the article comprises a multiplicity of thin film transistors.

14. An article according to claim 1, wherein the first organic material layer is an n-type organic material layer.

15. An article according to claim 8, wherein the polycrystalline first organic material has an average grain size, said average size being at least 2 μm.

* * * * *